United States Patent [19]
Mooney et al.

[11] Patent Number: 4,577,735
[45] Date of Patent: Mar. 25, 1986

[54] SHOCK ABSORBER FOR QUARTZ CRYSTAL ENCLOSURES USING MULTIPLE CONTACT POINTS TO DISTRIBUTE STRESS

[75] Inventors: Charles W. Mooney, Lake Worth; Robert E. Phipps, Pompano Beach; William J. Kuznicki, Coral Springs, all of Fla.

[73] Assignee: Motorola, Inc., Schaumburg, Ill.

[21] Appl. No.: 627,248

[22] Filed: Jul. 2, 1984

[51] Int. Cl.$^4$ .............................................. F16F 7/00
[52] U.S. Cl. .................................. 188/268; 267/153; 310/321; 310/326
[58] Field of Search ................... 188/268, 379, 380; 267/136, 153; 310/312, 321, 326

[56] References Cited

U.S. PATENT DOCUMENTS

| | | |
|---|---|---|
| 2,352,311 | 6/1944 | Di Toro . |
| 2,384,757 | 9/1945 | Kuenstler . |
| 2,546,321 | 3/1951 | Ruggles .............................. 310/312 |
| 2,676,275 | 4/1954 | Bigler . |
| 3,113,223 | 12/1963 | Smith et al. . |
| 3,423,542 | 1/1969 | Cvetko . |
| 3,619,672 | 11/1971 | Nagata et al. . |
| 3,980,022 | 9/1976 | Lungo ............................ 310/326 X |
| 3,986,150 | 10/1976 | Tanaka et al. . |
| 4,078,635 | 3/1978 | Dance et al. ........................ 188/268 |

*Primary Examiner*—Duane A. Reger
*Attorney, Agent, or Firm*—Mark P. Kahler; Joseph T. Downey; Edward M. Roney

[57] ABSTRACT

A shock absorbing mechanism for protecting a fragile quartz crystal includes a Teflon coating on the internal surface of the crystal enclosure. The enclosure is provided with a plurality of detents arranged so that when the crystal is shocked in its most fragile plane a plurality of these Teflon coated detents are struck simultaneously to distribute the shock across the surface of the crystal.

6 Claims, 7 Drawing Figures

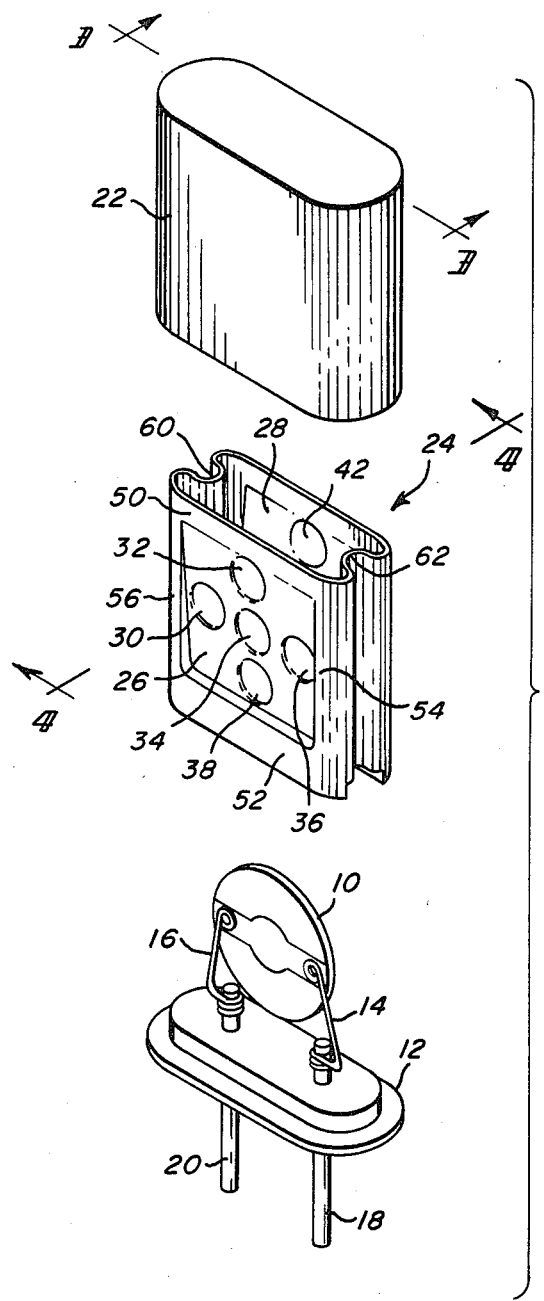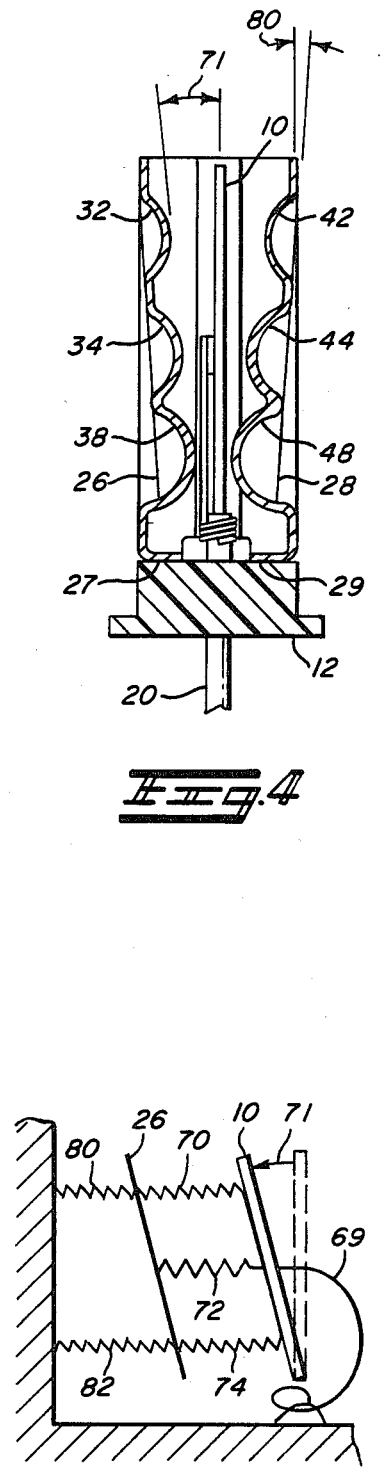

SHOCK ABSORBER FOR QUARTZ CRYSTAL ENCLOSURES USING MULTIPLE CONTACT POINTS TO DISTRIBUTE STRESS

BACKGROUND OF THE INVENTION

1. Field of the Invention

This invention relates generally to the field of shock protection for fragile quartz crystals and the like. More particularly, this invention relates to a shock absorbing mechanism for protecting quartz crystals from impact with the walls of its enclosure.

2. Background

Quartz crystals are frequently used in electronic radio equipment such as two-way radios, pagers and the like as high stability frequency determining elements. They are also used in such radio equipment as filtering elements due to their very high "Q" and therefore high selectivity.

Unfortunately, it has long been recognized that such crystal devices are usually the most fragile components in the radio equipment. This presents special problems when the radio equipment is used in an environment which makes it especially susceptible to high mechanical shock such as police radios or pagers which may be subject to frequent drops. In these environments it is not unusual for crystal devices to shatter or crack when presented with excess mechanical shock. The problem is compounded by the rapid miniaturization of such equipment making it subject to higher impact velocities when carelessly tossed about.

In order to enhance the reliability of such electronic equipment, it is clearly necessary to provide better mechanical shock protection for such crystal devices. Crystal devices which can consistently withstand shocks of approximately 20,000 to 30,000 times the force of gravity (20,000 to 30,000 G's) for approximately 0.3 milliseconds are needed to insure the reliability of such electronic devices at present and in the future even greater shock performance will be necessary. At present, shocks in excess of this limit are absorbed by deformation and damage to the plastic enclosures typically used on such equipment.

A number of solutions to this problem have been proposed and have met with varying degrees of success. Unfortunately, none of these proposals have been able to reliably and consistently enable such crystal devices to withstand mechanical shocks in excess of approximately 15,000 G's. Such proposals have included simply coating the inner surface of a crystal enclosure with plastic to absorb shock and inserting short sections of plastic tubing or plastic strips inside the crystal enclosure to absorb shock. While such techniques provide improvement of a factor of perhaps two to four times the shock levels crystal devices can withstand without them (typically approximately 2000 to 3000 G's unprotected), further improvement is required to achieve acceptable levels of reliability.

SUMMARY OF THE INVENTION

It is an object of the present invention to provide an improved shock absorber for fragile crystal devices.

It is another object of the present invention to provide a crystal shock absorber which will allow crystal devices to survive shocks in excess of 30,000 G's.

It is another object of the present invention to provide a crystal shock absorber which overcomes the deficiencies of other crystal shock absorbers.

It is another object of the present invention to provide an integral shock absorber for a crystal enclosure.

It is a further object of the present invention to provide a shock absorbing system for crystal devices which does not interfere with the normal operation of the crystal.

These and other objects of the present invention will become apparent to those skilled in the art upon consideration of the following description of the invention.

According to one embodiment of the present invention, a shock absorbing mechanism for protection of a planar crystal device against impact with a crystal enclosure wall, wherein the crystal device has opposed major surfaces and an edge, includes a shock absorbing device having a plurality of contact points for contacting one of the major surfaces when the crystal device is subjected to mechanical shock. A carrier holds the shock absorbing device between one of the major surfaces and the enclosure wall so that the plurality of contact points contact one of the opposed major surfaces when the crystal device is shocked by a force exceeding a predetermined magnitude in a direction toward the shock absorbing device and substantially perpendicular to the opposed major surfaces.

The features of the invention believed to be novel are set forth with particularity in the appended claims. The invention itself, however, both as to organization and method of operation, together with further objects and advantages thereof, may be best understood by reference to the following description taken in conjunction with the accompanying drawings.

BRIEF DESCRIPTION OF THE DRAWINGS

FIG. 1 shows an exploded view of one embodiment of the present invention.

FIG. 4 shows a side sectional view of the assembled crystal device excluding the cover along section lines 4—4.

FIG. 5 is a free-body diagram of the crystal device when shocked in a plane perpendicular to the plane of the crystal's major surfaces.

DESCRIPTION OF THE PREFERRED EMBODIMENT

Figure 3:
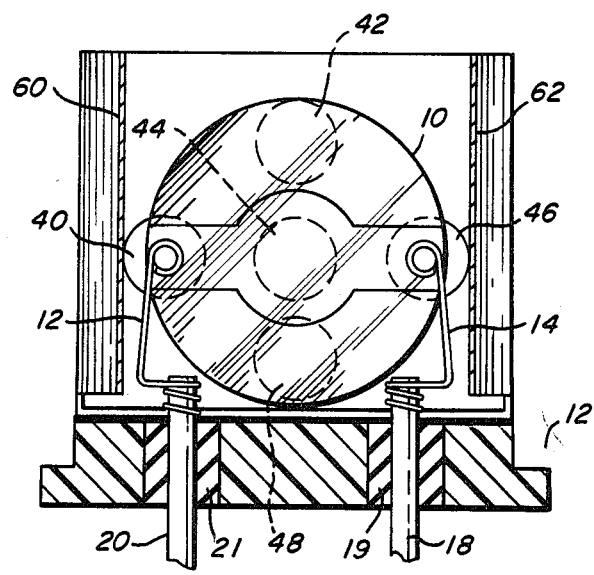
FIG. 3 shows a front sectional view of the assembled crystal device excluding the cover along section lines 3—3.

Turning now to FIG. 1, a quartz crystal device 10 is shown attached to a base 12 of a crystal enclosure. The crystal device 10 is normally a planar quartz structure with opposed major surfaces and may be connected to the base by spring type connectors 14 and 16 or by other known techniques as is well known in the art. These connectors also serve to electrically couple the crystal device 10 to electrical leads 18 and 20. Referring momentarily to FIG. 3, insulators 19 and 21 are used to insulate the leads from the metal base. The crystal device 10 is enclosed by an enclosure cover 22 for protection against the elements and physical damage. Cover 22 is typically made of metal and has a hard inner wall surrounding the crystal. Cover 22 may be attached to base 12 by conventional techniques such as soldering as is known in the art.

While cover 22 effectively shields the crystal device 10 from humidity, debris and other hazards of direct contact with the environment, the cover also is usually in close proximity to the crystal device in order to maximize volumetric efficiency of the package. In the event of a sudden mechanical shock, particularly in a direction perpendicular to the plane of the crystal device, the crystal device 10 may impact the inner wall of the enclosure cover 22 causing the crystal to shatter or crack resulting in failure of the crystal device.

Figure 2:
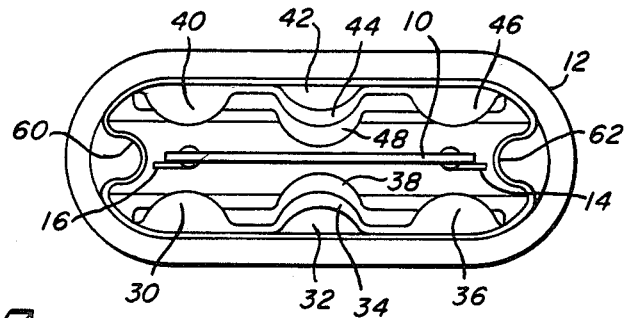
FIG. 2 shows a top view of the assembled crystal device excluding the cover.

According to one embodiment of the present invention, a Teflon (Dupont trademark for polytetrafluoroethylene) insert 24 is utilized to absorb the shock of sudden impact. The details of insert 24 may be more readily visible in FIGS. 2, 3 and 4 showing top, front and side cutaway views of the insert respectively. These Figures should be referred to in conjunction with FIG. 1 for a full understanding of the present embodiment. This insert is made by heated vacuum forming of a sheet of 0.004 to 0.005 inch thick Teflon film such as Dupont PFA 350 film in this embodiment. This particular dimension and type of film has been found suitable for the present embodiment for use with the industry standard HC-18 crystal enclosure. Other materials and dimensions may be suitable for this and other embodiments without deviation from the spirit of the invention. Since insert 24 is made of Teflon film, it may be made very thin compared with the tubing or strips of the prior art. The film may also be molded to produce controllable springs as will be discussed.

Insert 24 includes sloping walls 26 and 28 which serve as a carrier for a number of concave dimple springs 30, 32, 34, 36, 38, 40, 42, 44, 46, and 48. These dimple springs are specially formed and shaped to act as springs having appropriate spring rates to act as shock absorbers during mechanical shock. When inserted inside cover 22, edges 50, 52, 54 and 56 compress against the inner walls of the cover to form a self aligning insert. In addition, the sloping wall 26 is suspended and cushioned by the spring action of the thin Teflon springs formed at the interface of the edges 50, 52, 54 and 56 and sloping wall 26. A similar spring cushion mounting system is preferably present on both sides of the insert.

Flat projections 27 and 29 serve to facilitate insertion of insert into cover 22. Additionally, flat projections 27 and 29 stiffen the lower portion of the insert so that springs 38 and 48 do not buckle and permanently deform when the assembly is shocked. The opening at the lower portion of the insert serves as a target for the crystal and base during assembly. The insert is then inserted in the cover 22 and is held in place by spring tension. The length of the insert is selected to assure self-alignment when the base assembly is installed.

The spring structure above provides shock isolation when the crystal device is shocked by a force applied substantially in a direction perpendicular to the plane of the crystal. This is the most destructive plane of shock for the crystal. A pair of side ribs 60 and 62 are provided to provide shock isolation when the crystal device is shocked in a direction parallel to the plane of the crystal. This is a much less destructive plane of shock for the crystal and requires a less elaborate shock isolation system.

The spring rates of the dimple springs are determined by a number of factors including the thickness of the material and the radius and height of the dimples above the carrier wall. For the present embodiment of the invention for use with the HC-18 crystal enclosure, the dimensions of Table 1 have been found suitable to consistantly provide protection against shocks well beyond 30,000 G's. Of course it is understood that these specific dimensions and specifications are presented only by way of example and should not limit the scope of the present invention.

TABLE 1

| Parameter | Specification |
| --- | --- |
| Radius of dimple springs. | 0.037 inches |
| Height of springs 32 and 42. | 0.022 inches |
| Height of springs 30, 34, 36, 40, 44 and 46. | 0.027 inches |
| Height of springs 38 and 48. | 0.040 inches |
| Center to center separation of bubble springs 32 and 34, and 42 and 44. | 0.095 inches |
| Center to center separation of bubble springs 34 and 38, and 44 and 48. | 0.083 inches |
| Center to center separation of bubble springs 30 and 34, 34 and 36, 40 and 44, and 44 and 46. | 0.149 inches |
| Slope of carrier wall measured from vertical after restraint in cover 22 (angle 80) | 4.0 degrees |
| Slope of dimple springs measured from vertical (angle 71) | 10.0 degrees |
| Location of dimple springs 34 and 44. | Axis of center of gravity of crystal |
| Radius of innermost radius of rib spring after restraint | 0.016 inches |
| Center to center separation of rib springs after restraint | 0.325 inches |
| Thickness of film after forming excluding dimple springs | 0.003 inches |
| Thickness of dimple springs at point closest to crystal after forming | 0.0006 inches |

The operation of the present invention may be more fully appreciated with reference to the free-body diagram of FIG. 5. Assuming the crystal device is shocked by a force applied perpendicular to the major surfaces of the crystal, the crystal deflects at an angle as shown due to the high center of gravity and the effects of the spring connectors depicted as spring 69 of FIG. 5. The crystal blank impacts each spring of the array of dimple springs substantially simultaneously distributing the force over the entire surface of the crystal. The shock force is then absorbed and dissipated by the dimple springs represented as springs 70, 72 and 74 in conjunction with the spring cushion mechanism which supports carrier wall 26. This spring cushion mechanism is depicted as springs 80 and 82 in FIG. 5.

If the crystal device is shocked at an angle which is not exactly perpendicular to the plane of the crystal, it may initially strike only one of the dimple springs. The spring cushion mechanism represented by springs 80 and 82 is designed to have a lower spring rate than those of any of the dimple springs and in the present embodiment a spring rate of approximately 0.88 pounds per inch has been found acceptable. This lower spring rate allows the carrier wall 26 to pivot so that another of the dimple springs will contact the crystal surface. When three of the dimple springs have been contacted, the center of gravity of the crystal applies pressure to spring 34 and the stress of the shock is effectively distributed throughout the surface of the crystal. At this point the deflection of both the dimple springs and the spring cushion work together to absorb the shock of impact.

It has been found especially advantageous to utilize five dimple springs in this embodiment with one near the center of the crystal blank and one adjacent each of the four crystal quadrants. The advantages of this may be better understood by modeling the crystal as a vibrating circular plate having simply supported edges. In addition to the conventional vibration modes of a quartz crystal, the quartz crystal may take on any of a number of high stress vibration modes such as those of the conventional vibrating plate model when the crystal device is mechanically shocked. Such models are well known and may be found for example in "Mechanical Vibration and Shock Measurement", by Prof. Jenstrampe Broch, 1980, Bruel and Kjaer, ISBN Number 87 87355 36 1. In each of the highest stress modes of vibration an antinode of vibration is located either at the center of the plate or near the center of one of the four quadrants. By providing a damped spring force in each of the four quadrants and the center, both the level and duration of vibrating stresses are reduced.

The dimple springs are preferably designed to have a nonlinear spring rate. This is readily accomplished by making the thickness of the Teflon film gradually decrease as the portion of the spring closest to the crystal is approached. In the present embodiment, this thickness starts out at approximately 0.003 inches at the carrier wall and decreases to about 0.0006 inches at the innermost point. The change in thickness is not shown in the Figures. This results in an initially low spring rate of approximately 0.1 pounds/inch which increases to an almost linear spring rate (listed below) as the spring is compressed.

In addition, the spring rates of the springs preferrably decrease as the base 12 is approached. This is advantageous due to the increased velocity of the crystal near the top and relatively lower velocity near the base when shocked perpendicular to the crystal's major surfaces. By utilizing stiffer springs near the top, the greater velocities of impact are more readily absorbed further enhancing reliability. In the present example, the spring rate of dimple springs 32 and 42 is approximately 3.3 pounds per inch. The spring rate for dimple springs 30, 34, 36, 40, 44 and 46 is approximately 2.9 pounds per inch. The spring rate of dimple springs 38 and 48 is approximately 2.2 pounds per inch. The combined spring rate for all five dimple springs on each carrier wall is approximately 14.2 pounds per inch. Of course, these spring rates are not to be limiting. These combinations of spring rates and dimensions have been found to be effective for thin crystal blanks on the order of 0.003 inches thick with a mass of roughly 0.01 grams including spring connectors 14 and 16 and provides reliable and repeatable protection against mechanical shocks well beyond 30,000 G's without interfering with the operation of the crystal in any way. As the thickness of the crystal device increases, it becomes less fragile and the spring rates may be adjusted accordingly.

Figure 6:
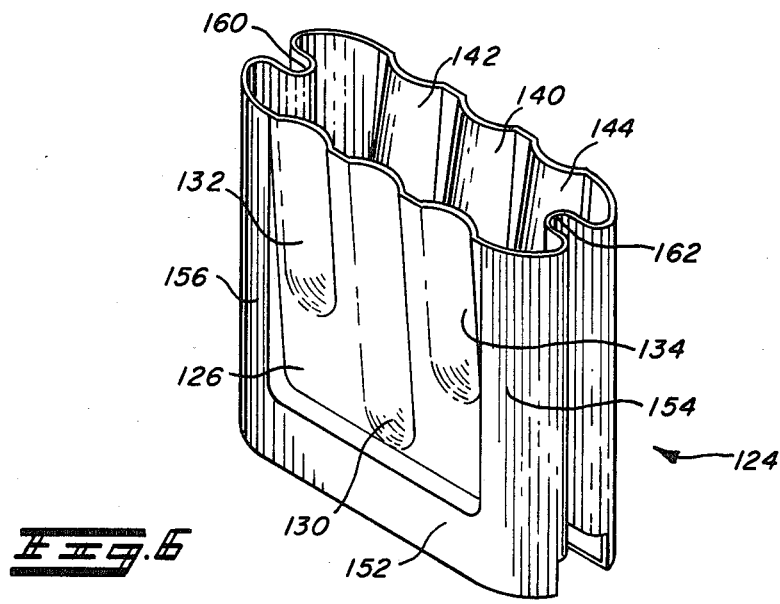
FIG. 6 shows an alternate embodiment of the present invention using rib springs.

In an alternate embodiment, rib springs may be used in place of the dimple springs. This embodiment is illustrated in FIG. 6 in which insert 124 is depicted. The overall structure of the insert is very similar to that of insert 124 except for the substitution of rib springs 130, 132, 134, 140, 142 and 144 for the dimple springs. These rib springs are supported by carrier walls such as wall 126 which is at a similar angle to wall 26. The height of the rib springs tapers inward toward the crystal device similar to the way the dimple springs tapered in the previous embodiment.

Due to slightly different manufacturing technique, it is more difficult and therefore more expensive to obtain varying material thickness with the rib springs in order to obtain the desired nonlinear spring rate. It is however a desirable feature if the added expense is acceptable. Otherwise, the thickness may be left at approximately the original film thickness with acceptable results. It should be noted that the spring rate of the ribs varies continuously over the length of the rib to obtain the desired change in spring rates for the varying distance from the base. The dual spring system of the present embodiment functions in the same manner as that of the previous embodiment wherein the cushion spring system is bordered by 152, 154 and 156.

Figure 7:
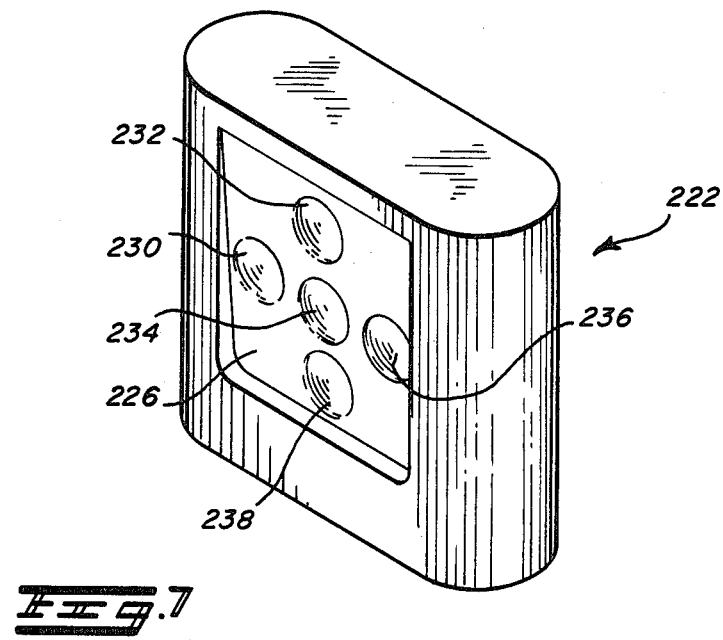
FIG. 7 shows an alternate embodiment of the present invention using a detented enclosure cover as the carrier for the springs.

In another embodiment, sloping dimple or rib or other appropriately shaped springs may be formed as shown in FIG. 7. In this embodiment (illustrated with dimple springs) a plurality of dimple springs 230, 232, 234, 236, 238, 240, 242, 244, 246 and 248 are implemented by forming appropriate sized detents in a crystal enclosure cover 222. A Teflon or similar coating may then be applied to the inner coating of the cover 222 by spraying electrostatically charged particles inside the cover or by other known methods of obtaining a consistant coating. A smooth coating of approximately 0.015 to 0.005 inches in thickness is appropriate to provide an acceptable level of protection. The springs are created in a geometry which allows the surface of the crystal to impact each of the springs adjacent the surface being impacted substantially simultaneously similar to the other embodiments. This results in distribution of stress throughout the crystal when shocked in its most fragile plane.

In this embodiment, the shock is absorbed by the compression of the Teflon coating whereas the previous embodiments utilized both the compression and the flexure of the springs to absorb the impact. In addition, the present embodiment uses only a single spring system rather than the cushion spring and the dimple (or rib etc.) spring system discussed previously. As a result, the present embodiment will not provide protection as effectively as the previous embodiments. Improvements in shock performance on the order of 7 to 8 times that of an unprotected crystal can be anticipated. In some applications this level of protection may be adequate and the use of the present embodiment may provide manufacturing advantages by reducing the number of parts required for final assembly of the crystal package. Slight size reduction may also be possible by using the present embodiment.

While the embodiments presented are specifically directed toward crystal enclosures having somewhat oval cross sections, it will be evident to those skilled in the art that the present invention may be readily adapted to other crystal enclosure geometries such as the cylindrical I.B.P. type package by making suitable modifications. Suitable modifications may also be made to the spring materials and spring geometries without deviating from the scope of this invention.

Thus it is apparent that in accordance with the present invention an apparatus that fully satisfies the objectives, aims and advantages is set forth above. While the invention has been described in conjunction with specific embodiments, it is evident that many alternatives, modifications, and variations will become apparent to those skilled in the art in light of the foregoing description. Accordingly, it is intended that the present invention embrace all such alternatives, modifications and variations as fall within the spirit and broad scope of the appended claims.

What is claimed is:

1. A shock absorbing mechanism for protection of a planar crystal device against impact with a crystal enclosure wall, said crystal device having opposed major surfaces, said shock absorbing mechanism comprising:

shock absorbing means having a plurality of deformable protuberances for contacting one as said major surfaces when said crystal device is subjected to mechanical shock; and carrier means for holding said shock absorbing means between one of said major surfaces and said enclosure wall so that said plurality of deformable protuberances contact one of said opposed major surfaces substantially simultaneously when said crystal device is shocked by a force exceeding a predetermined magnitude in a direction toward said shock absorbing means and substantially perpendicular to said opposed major surfaces.

2. The shock absorbing mechanism of claim 1 wherein said plurality of deformable protuberances are arranged so that at least one of each of the contact points contacts one of four quadrants of one of said major surfaces when said crystal device is shocked by said force.

3. The shock absorbing mechanism of claim 1, wherein one of said deformable protuberances contacts the center of gravity of said crystal device when shocked by said force.

4. The shock absorbing mechanism of claim 1, wherein said shock absorbing means includes a dimple spring.

5. The shock absorbing mechanism of claim 1 wherein said shock absorbing means includes a rib spring.

6. The shock absorbing mechanism of claim 4 wherein said dimple spring is a compression type dimple spring.

* * * * *